(12) United States Patent
Balakrishnan

(10) Patent No.: US 7,135,748 B2
(45) Date of Patent: Nov. 14, 2006

(54) INTEGRATED CIRCUIT WITH MULTI-LENGTH OUTPUT TRANSISTOR SEGMENT

(75) Inventor: Balu Balakrishnan, Saratoga, CA (US)

(73) Assignee: Power Integrations, Inc., San Jose, CA (US)

( * ) Notice: Subject to any disclaimer, the term of this patent is extended or adjusted under 35 U.S.C. 154(b) by 72 days.

(21) Appl. No.: 10/984,442

(22) Filed: Nov. 8, 2004

(65) Prior Publication Data

US 2006/0088958 A1 Apr. 27, 2006

Related U.S. Application Data

(63) Continuation-in-part of application No. 10/974,176, filed on Oct. 26, 2004.

(51) Int. Cl.
*H01L 29/772* (2006.01)
(52) U.S. Cl. ............... 257/401; 257/368; 257/206; 257/E29.011
(58) Field of Classification Search .......... 257/401, 257/206, 368, 500, 350, 341, 342
See application file for complete search history.

(56) References Cited

U.S. PATENT DOCUMENTS

| | | | |
|---|---|---|---|
| 4,779,161 A * | 10/1988 | DeShazo, Jr. ............... | 361/106 |
| 4,808,861 A * | 2/1989 | Ehni ............................. | 327/389 |
| 5,729,032 A | 3/1998 | Tomomatsu et al. | |
| 5,748,025 A | 5/1998 | Ng et al. | |
| 6,316,807 B1 | 11/2001 | Fujishima et al. | |
| 6,552,597 B1 | 4/2003 | Disney | |
| 6,586,283 B1 | 7/2003 | Corcoran et al. | |
| 6,734,714 B1 | 5/2004 | Disney | |
| 6,867,465 B1 * | 3/2005 | Dono ........................... | 257/401 |
| 2002/0153585 A1 * | 10/2002 | Asano et al. ................ | 257/472 |
| 2004/0004497 A1 | 1/2004 | Sheng et al. | |
| 2005/0225362 A1 | 10/2005 | Halamik et al. | |

* cited by examiner

*Primary Examiner*—Jerome Jackson
*Assistant Examiner*—Paul Budd
(74) *Attorney, Agent, or Firm*—Burgess & Bereznak, LLP

(57) ABSTRACT

A monolithic integrated circuit fabricated on a semiconductor die includes a control circuit and a first output transistor having segments substantially equal to a first length. A second output transistor has segments substantially equal to a second length. The first and second output transistors occupy an L-shaped area of the semiconductor die, the L-shaped area having first and second inner sides that are respectively disposed adjacent first and second sides of the control circuit. At least one of the first and second output transistors is coupled to the control circuit. It is emphasized that this abstract is provided to comply with the rules requiring an abstract that will allow a searcher or other reader to quickly ascertain the subject matter of the technical disclosure. It is submitted with the understanding that it will not be used to interpret or limit the scope or meaning of the claims. 37 CFR 1.72(b).

33 Claims, 6 Drawing Sheets

INTEGRATED CIRCUIT WITH MULTI-LENGTH OUTPUT TRANSISTOR SEGMENT

RELATED APPLICATIONS

This is a continuation-in-part (CIP) application of application Ser. No. 10/974,176 filed Oct. 26, 2004, entitled, "INTEGRATED CIRCUIT WITH MULTI-LENGTH POWER TRANSISTOR SEGMENTS", which is assigned to the assignee of the present CIP application.

FIELD OF THE INVENTION

The present invention relates generally to the field of semiconductor devices; more specifically, to monolithic integrated circuits (ICs) and to methods of manufacturing IC devices.

BACKGROUND OF THE INVENTION

Integrated circuits (ICs), including power integrated circuits (PICs), find application in an increasingly wide variety of electronic devices. Typically, PICs comprise one or more high-voltage field effect transistors (HVFETs) having a device structure such as those disclosed in U.S. Pat. No. 6,207,994 ("the '994 patent"), which is herein incorporated by reference. Each of the devices disclosed in the '994 patent has a source region and a drain region separated by an intermediate region. A gate structure is disposed over a thin oxide layer over the metal-oxide-semiconductor (MOS) channel of the device. In the on state, a voltage is applied to the gate to cause a conduction channel to form between the source and drain regions, thereby allowing current to flow through the device. In the off state, the voltage on the gate is sufficiently low such that no conduction channel is formed in the substrate, and thus no current flow occurs. In this condition, high voltage is supported between the drain and source regions.

Most integrated circuits contain one or more output transistors that control current flow through one or more external loads. By way of example, FIG. 7 of the '994 patent discloses a structure having interdigitated source and drain regions that is commonly utilized as an output transistor in many types of power devices. In the design of a particular PIC, these elongated source/drain segments may be replicated to increase the current handling capability of the power device.

FIG. 1 shows a typical prior art IC fabricated on a semiconductor die 10 having an aspect ratio defined as the ratio of the length (L) to the width (W). Included on semiconductor die 10 is a control circuit 11 that is utilized to control on/off switching of an output transistor 12. In IC designs, it is customary to utilize a single standardized control circuit design coupled to a variety of output transistor layouts of differing sizes (e.g., number of segments) to create a family of devices with similar functionality, but with differing current handling capability. For example a family of ICs, each with differing current handling capabilities, may be created by increasing the number of parallel segments of transistor 12. According to this traditional approach, ICs with larger current handling capability have a larger width (W) to accommodate more source/drain segments, but the same length (L). In other words, in prior art IC designs, the length of the output transistor is substantially constant, and equal to the length of control circuit 11. Integrated circuit devices with more current handling capability have more segments added in parallel, which increases the width of the semiconductor die.

To achieve maximum utilization of the package space that houses semiconductor die 10, control circuit 11 is usually designed with a length that is much larger than its width. For example, in a typical IC product family the smallest device is designed to be long and narrow (i.e., large aspect ratio), with larger devices having an increased width dimension due to the added number of output transistor segments (i.e., smaller aspect ratio). That is, the aspect ratio of larger devices decreases as more segments are added.

Aspect ratio is a critical parameter in the design of most monolithic ICs, including, by way of example, power integrated circuit devices. An IC fabricated on a semiconductor die having a very large or very small aspect ratio often suffers from mechanical stress caused by the molding compound used to package the die. This stress can adversely change the electrical properties of the IC circuitry. For minimum stress a semiconductor die should have an aspect ratio that is close to 1.0, i.e., a length that is substantially equal to its width. The difficulty, however, is that the output transistors are often required to have elongated segments in order to achieve area efficiency and a specific current handling capability. The package also has maximum cavity size. Thus, while it is desirable to manufacture an IC on a semiconductor die having a substantially square shape, the need to provide a product family with a range of current handling capabilities which fits within a package cavity size has constrained the dimensions of the control circuitry and semiconductor die 10.

The solution of the prior art has been to provide a control circuit that has a relatively narrow width and a much larger length that is substantially equal to the maximum package cavity size. For example, in FIG. 1 the length of control circuit 11 is about four times its width. However, this causes area inefficiencies due to control circuit wiring. Another significant shortcoming of this prior art approach is that in IC devices with small output field-effect transistors (i.e., fewer segments) suffer from package stress problems caused by high semiconductor die aspect ratio.

Thus, there is an unsatisfied need for an improved monolithic IC design that overcomes the problems of poor control circuit area efficiency and high IC aspect ratio.

BRIEF DESCRIPTION OF THE DRAWINGS

The present invention will be understood more fully from the detailed description that follows and from the accompanying drawings, which however, should not be taken to limit the invention to the specific embodiments shown, but are for explanation and understanding only.

DETAILED DESCRIPTION

An improved integrated circuit is described. In the following description, numerous specific details are set forth, such as device types, dimensions, circuit configurations, etc., in order to provide a thorough understanding of the present invention. However, persons having ordinary skill in the semiconductor arts will appreciate that these specific details may not be needed to practice the present invention.

Figure 1:
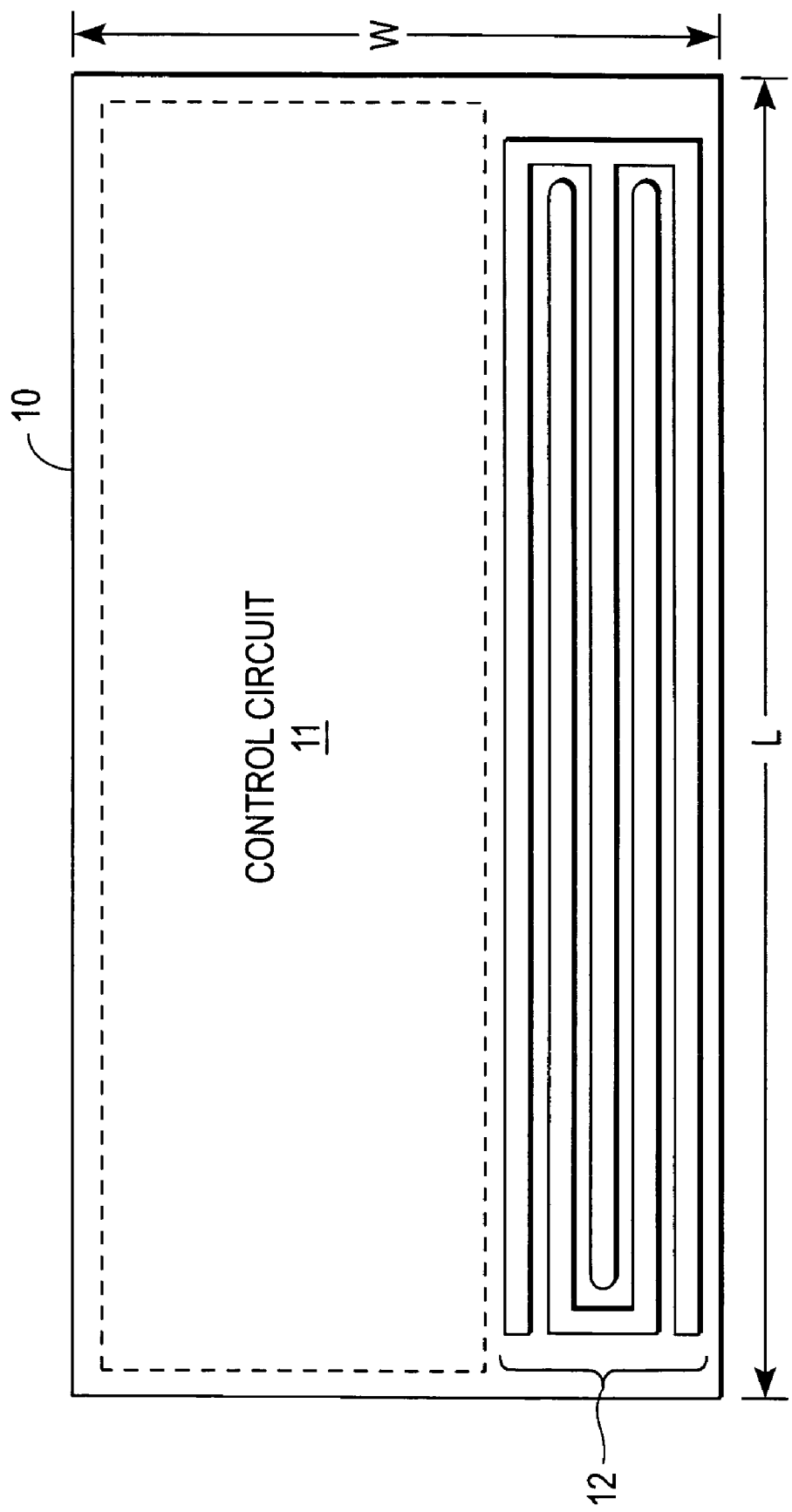
FIG. 1 shows a circuit layout of a prior art monolithic integrated circuit.
Figure 2:
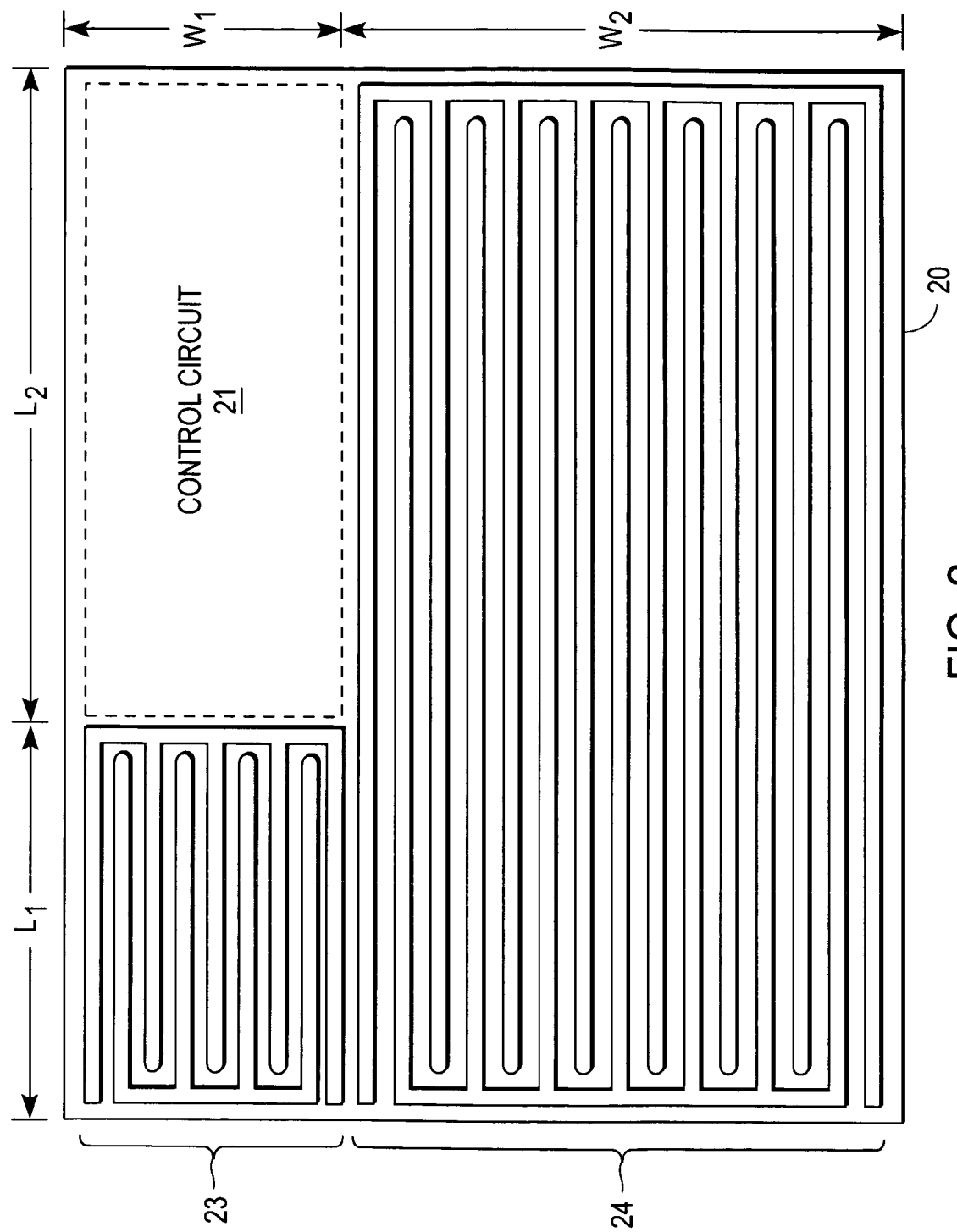
FIG. 2 is circuit layout illustrating an integrated circuit according to one embodiment of the present invention.

FIG. 2 illustrates a circuit layout of a monolithic IC according to one embodiment of the present invention. (In the context of the present application, the term "IC" is considered synonymous with a monolithic device.) In the example of FIG. 2, the IC shown may comprise a power integrated circuit (PIC) fabricated on a semiconductor die 20, which includes a first output HVFET 23 having a set of relatively short interdigitated source/drain segments, and a second output HVFET 24 having a set of relatively long interdigitated source/drain segments. The segments of HVFETs 23 & 24 are placed on die 20 in a manner that optimizes the layout of control circuit 21. The arrangement of HVFETs 23 & 24 also improves the layout of the complete PIC such that die 20 has a better aspect ratio as compared to prior art devices, even for implementations with low current handling capability. It should be understood, however, that the present invention is not limited to PICs and may find application in a wide variety of IC designs having a multitude of voltage and current handling characteristics.

As can be seen, output transistor 23, with the short segments, is located on die 20 adjacent the short, lateral side of control circuit 21. In one implementation, control circuit 21 comprises a switched mode regulator control circuit. Control circuit 21 and transistor 23 both have substantially the same width ($W_1$). The total length (L) of semiconductor die 20 is approximately equal to the sum of the lengths of transistor 23 and control circuit 21 ($L \approx L_1 + L_2$).

In the embodiment of FIG. 2, output transistor 24 is shown located on die 20 adjacent the long, bottom side of control circuit 21, and also extending beneath the length of transistor 23. The length of the segments of output transistor 24 is substantially equal to the length ($L_2$) of control circuit 21 plus the length ($L_1$) of the segments of output transistor 23. In other words, the short transistor segments are placed alongside the short side of control circuit 11 such that the combined control circuit and short transistor segment length is substantially the same as the length of the long segments of transistor 24. In the embodiment shown, each of the output transistors is of the same conductivity type, i.e., n-type or p-type. (In embodiments where the output transistors are bipolar devices, each of the output transistors are also of the same type, i.e., npn or pnp devices.)

The total width (W) of semiconductor die 20 is approximately equal to the sum of the widths of control circuit 21 and transistor 24 ($W \approx W_1 + W_2$). To manufacture an IC device with increased current handling capability, more long segments are added in parallel to transistor 24, which has the effect of increasing the $W_2$ dimension and lowering the aspect ratio of semiconductor die 20.

Another way of viewing the embodiment of FIG. 2 is to consider the output transistors 23 and 24 as occupying an L-shaped area of semiconductor die 20, with the two inner sides of the L-shaped area being located adjacent two corresponding sides of control circuit 21. That is, one of the inner sides of the L-shaped area has a length substantially equal to the length ($L_2$) of control circuit 21, with the other inner side of the L-shaped area having a length substantially equal to the width ($W_1$) of control circuit 21. The two outer sides of the L-shaped area have dimensions that are substantially equal to the overall length ($L \approx L_1 + L_2$) and width ($W \approx W_1 + W_2$) of semiconductor die 20, respectively.

Practitioners in the integrated circuit and semiconductor fabrication arts will appreciate that the embodiment shown in FIG. 2 permits control circuit 21 to have a layout with an optimum aspect ratio that provides better area efficiency than prior art designs. In the implementation shown in FIG. 2, the length ($L_2$) of control circuit 21 is about three times its width ($W_1$). Furthermore, the novel use and placement of multiple output transistors having different segment lengths results in an aspect ratio closer to 1.0 for the complete IC. This means that a family of IC devices, each with different current handling capability, may be manufactured on a semiconductor die 20, each having an aspect ratio closer to 1.0. For the embodiment shown in FIG. 2, the aspect ratio of die 20 is about 1.6.

With continuing reference to FIG. 2, an IC device having a relatively small current handling capability may be realized by connecting control circuit 21 to output transistor 23, but not to output transistor 24. An IC device having increased current handling capability may be implemented by connecting control circuit 21 to both output transistor 23 and output transistor 24, or just to output transistor 24 and not output transistor 23. In one embodiment, both of the output transistors are connected in parallel to act as a single larger output transistor which is connected to the control circuit. In one embodiment, both of output transistors 23 and 24 have a breakdown voltage greater than 100V. IC devices that provide even larger current handing capability may be realized by increasing the number of long segment of output transistor 24 during the layout and manufacturing of semiconductor die 20. In each case, the dimensions of control circuit 21 remain the same. Reasonable aspect ratios may be maintained by extension of the length of the transistor segments of output transistors 23 & 24 as the number of segments of output transistor 24 increases. In accordance with the present invention, a complete family of IC devices having a wide range of current handling capabilities may be implemented on a semiconductor die having an aspect ratio within a range of 0.5 to 2.0.

Another possible configuration is to have only one of the output transistors 23 & 24 coupled to control circuit 21, with the other output transistor being available for use as an independent transistor for connection to other off-chip circuitry.

It should be understood that even though the embodiment of FIG. 2 illustrates two output transistors with different length segments, there is no restriction on the number of output transistors that may be included on die 20. That is, more than two output transistors having different length segments may be included on die 20.

For example, an IC with four output transistors may be implemented in which two additional transistors are located side-by-side on die 20 above or below transistor 24. The two additional output transistors may have a combined segment length that is approximately equal to the sum of the lengths of transistor 23 and control circuit 21 ($L \approx L_1 + L_2$). In such as case, the segment lengths of the two additional transistors may have an intermediate length that is longer than that of the short segments of transistor 23, yet shorter than the length of the long segments of transistor 24. These additional transistors with intermediate length segments may be selectively coupled to control circuit 21 to implement an IC device providing an intermediate range of output current capacity.

Persons of ordinary skill in the integrated circuit and semiconductor arts will appreciate that selective coupling between control circuit 21 and one or both of the output transistors 23 & 24 may be achieved utilizing a variety of conventional techniques and circuits. For example, an optional metal connection may be implemented during the layout and fabrication of the IC. Alternatively, an ordinary on-chip switching circuit may be utilized for selectively coupling one or more of the output transistors to control circuit 21. This switching circuit may be incorporated into the layout of control circuit 21 and may comprise one or more transistor switching devices (e.g., transmission gates).

Figure 3:
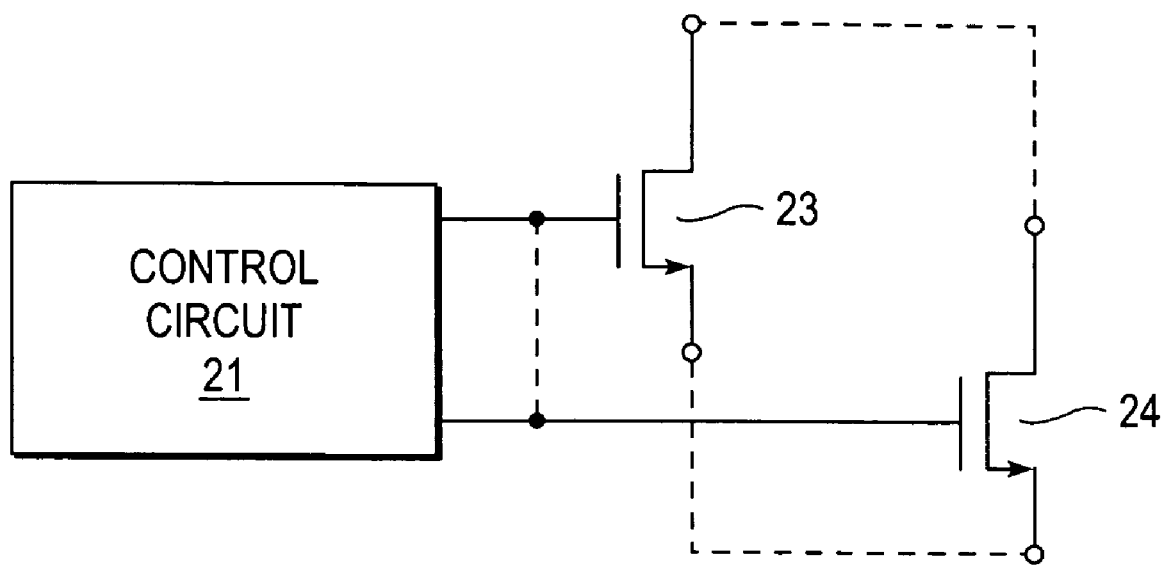
FIG. 3 is a circuit schematic diagram that corresponds to the integrated circuit shown in FIG. 2.

FIG. 3 is a circuit schematic diagram that corresponds to the monolithic power integrated circuit shown in FIG. 2. As explained previously, control circuit 21 may be selectively coupled to output transistor 23 or to output transistor 24, or to both transistors 23 & 24. This latter case is depicted by the dashed line showing a common connection to each of the three terminals (i.e., source, drain, and gate) of the respective output transistors. In one embodiment the output transistors are HVFETs that are connected in parallel to effectively act as a single HVFET which is switched on and off by the control circuit. In one embodiment the control circuit is a switching regulator circuit. Alternatively, the output transistors may have only one or two terminals coupled together (i.e., only the source terminals).

Figure 4:
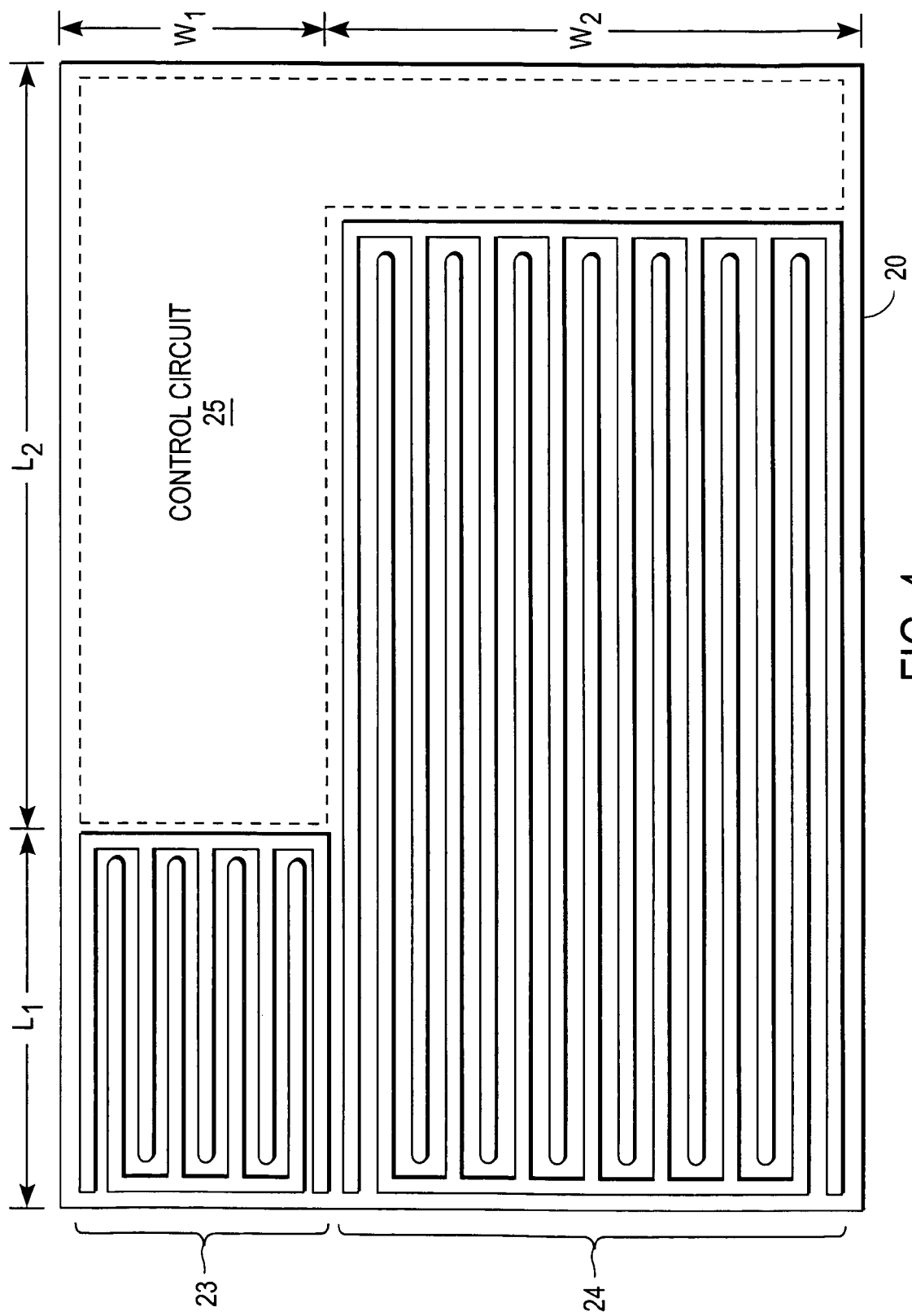
FIG. 4 is circuit layout illustrating an integrated circuit according to another embodiment of the present invention.

With reference now to FIG. 4, an alternative embodiment of an integrated circuit according to the present invention is shown including a control circuit 25 that occupies an L-shaped corner area of semiconductor die 20. In this embodiment, one outer side of the L-shaped area occupied by control circuit 25 has a length $L_2$, with the other outer side having a dimension substantially equal to the overall width ($W \simeq W_1+W_2$) of semiconductor die 20. Output transistors 23 and 24 occupy an L-shaped area of die 20 adjacent to control circuit 25, such that die 20 has an overall rectangular shape with an aspect ratio within a range of 0.5 to 2.0. In this example, output transistor 23 is located adjacent the left-hand side of control circuit 25 and has a width $W_1$ that is substantially equal to the width of the upper portion of control circuit 25. Either one (or both) of the output transistors 23 & 24 is coupled to control circuit 25. In FIG. 4 output transistor 24 is shown located beneath output transistor 23 and adjacent the upper inner side of control circuit 24. In this embodiment, the length of the transistor segments of output transistor 24 is less than the overall length of semiconductor die 20, which overall length (L) is substantially equal to the sum of the length ($L_1$) of output transistor 23 plus the length ($L_2$) of the upper section of control circuit 25.

Figure 5:
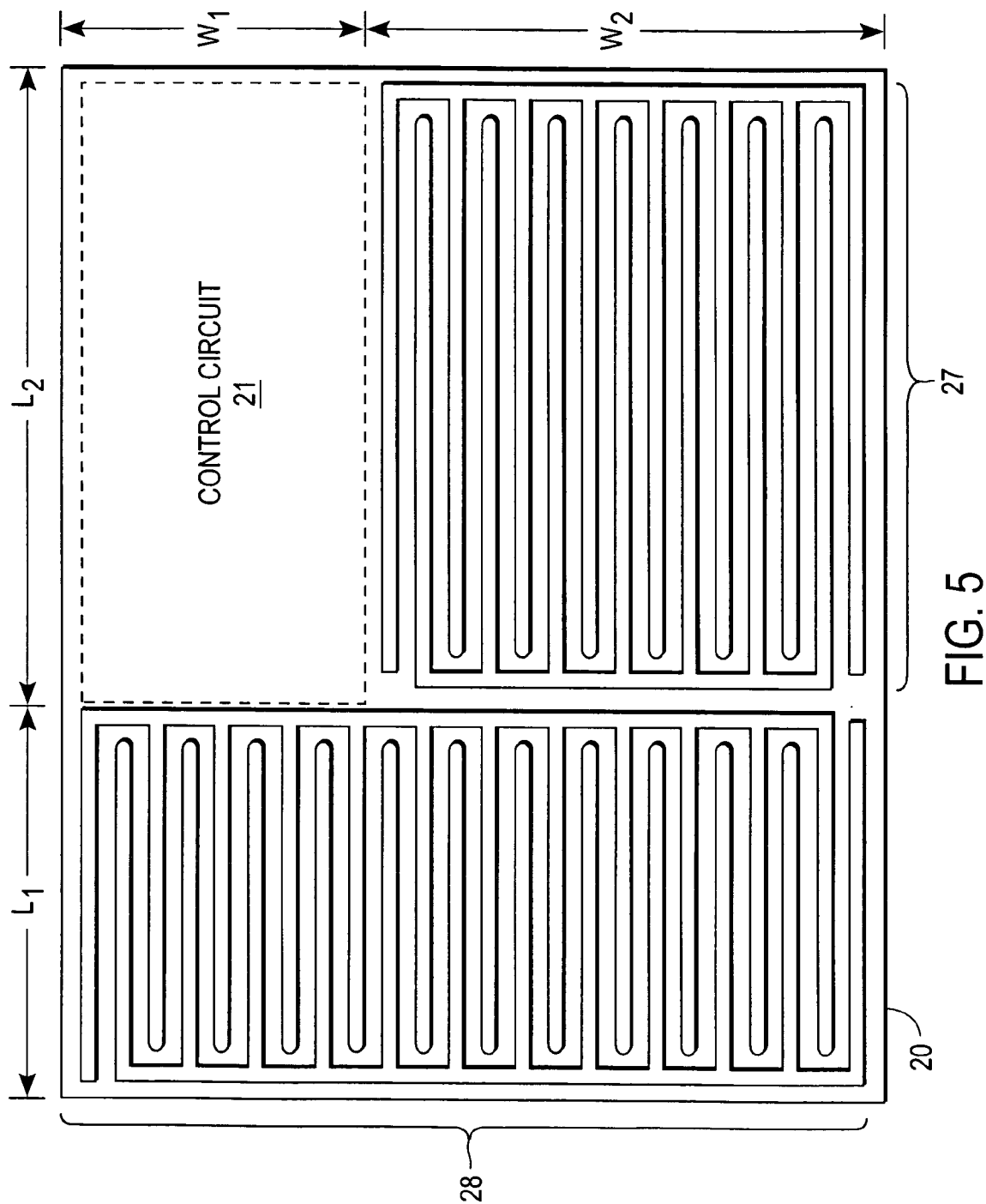
FIG. 5 is circuit layout illustrating an integrated circuit according to still another embodiment of the present invention.

FIG. 5 shows yet another alternative embodiment of the present invention that includes a standardized control circuit 21 coupled to one or both of output transistors 27 and 28. In this embodiment, output transistor 28 occupies an area adjacent one side of control circuit 21 and has transistor segments substantially equal to a length $L_1$. Unlike the embodiment of FIG. 2, however, output transistor 28 has a much greater number of segments such that the width of transistor 28 is substantially equal to the overall width (W) of semiconductor die 20. Output transistor 27 has a plurality of transistor segments, each of which has a length substantially equal to the length ($L_2$) of control circuit 21. The width ($W_2$) of output transistor 27 plus the width ($W_1$) of control circuit 21 is substantially equal to the overall width (W) of semiconductor die 20. Like the previous embodiments, control circuit 21 is selectively coupled to one or both of output transistors 27 & 28.

Figure 6:
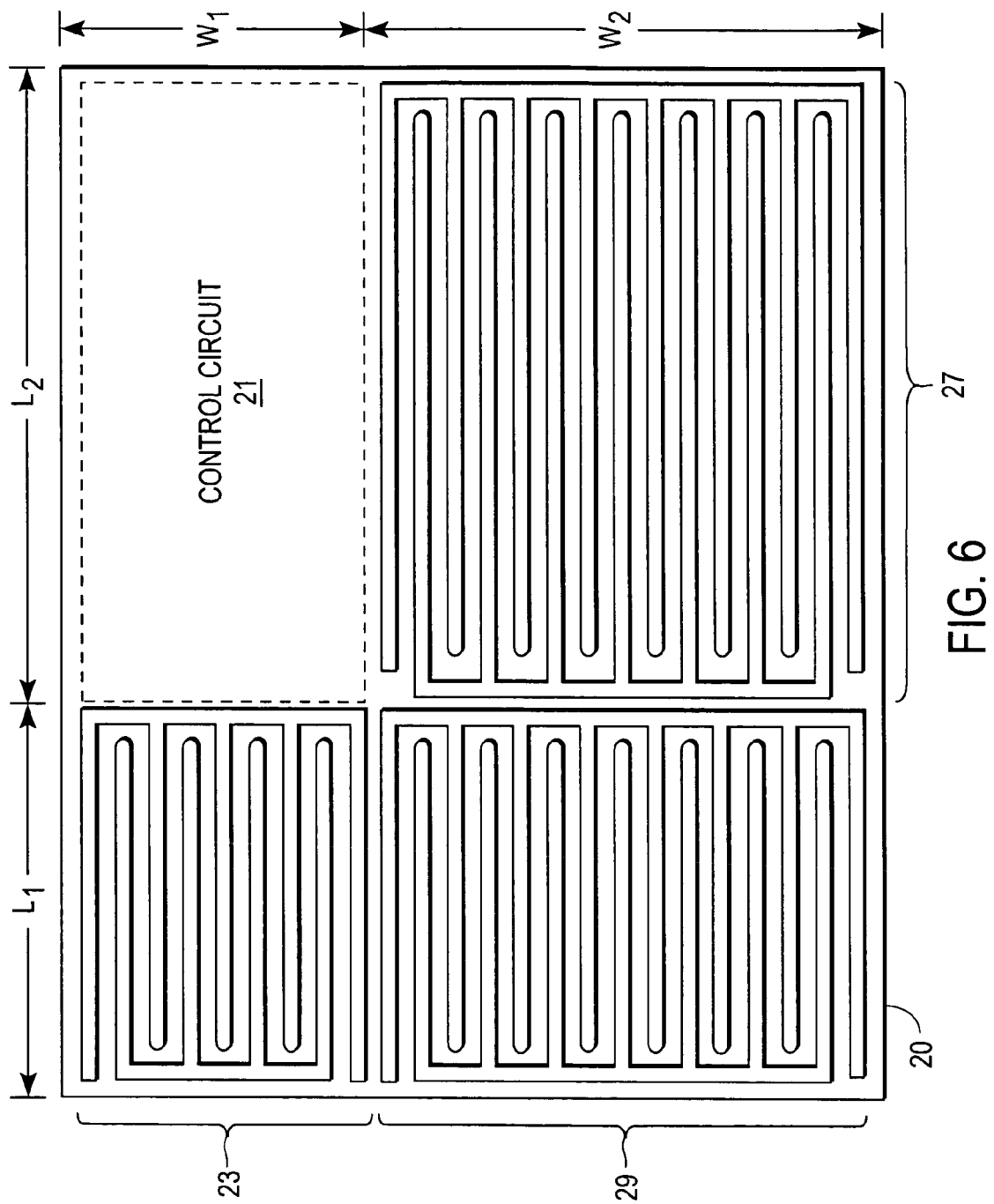
FIG. 6 is circuit layout illustrating an integrated circuit according to yet another embodiment of the present invention.

FIG. 6 illustrates an integrated circuit in accordance with still another alternative embodiment of the present invention. The embodiment of FIG. 6 includes an output transistor 27 disposed adjacent one side of control circuit 21, as in the embodiment of FIG. 5. The single output transistor 28 of FIG. 5, however, is replaced in FIG. 6 by a pair of output transistors 23 & 29 that occupy the same area adjacent the left-hand sides of transistor 27 and control circuit 21. Both transistors 23 & 29 have segments with substantially the same length ($L_1$). Output transistor 23 has a width substantially equal to the width ($W_1$) of control circuit 21. Output transistor 29 has a width substantially equal to the width ($W_2$) of output transistor 27. In the embodiment of FIG. 6, control circuit 21 is coupled to one or more of transistors 23, 27, and 29, depending on the current handling capacity required. For example, in applications requiring maximum current handling capacity control circuit 21 would be coupled to all three transistors 23, 27, and 29. In cases where less than all of the output transistors are connected to control circuit 21, the unconnected output transistors may be available for use as independent transistor s coupled to other off-chip circuitry.

Although the present invention has been described in conjunction with specific embodiments, those of ordinary skill in the arts will appreciate that numerous modifications and alterations are well within the scope of the present invention. Accordingly, the specification and drawings are to be regarded in an illustrative rather than a restrictive sense.

I claim:

1. An integrated circuit (IC) fabricated on a semiconductor die, comprising:
    a control circuit occupying a first area of the semiconductor die, the control circuit having first and second sides, the first side being orthogonal to the second side;
    a first output transistor occupying a second area of the semiconductor die, the first output transistor having a first length that extends in a direction parallel to the first side;
    a second output transistor occupying a third area of the semiconductor die, the second output transistor having a second length that extends in a direction perpendicular to the second side, the second length being substantially equal to a difference between the first length and the length of the first side, the first length being at least 20% longer than a length of the first side of the control circuit; and
    wherein at least one of the first and second output transistors are coupled to the control circuit.

2. The IC of claim 1 wherein the second output transistor has a width that is substantially equal to a width of the second side of the control circuit.

3. The IC of claim 1 wherein the first and second output transistors each have a breakdown voltage greater than 100V.

4. The IC of claim 3 wherein the first and second output transistors each comprise field-effect transistors.

5. The IC of claim 4 wherein the first and second output transistors have the same conductivity type.

6. The IC of claim 5 wherein the first and second output transistors comprise n-channel field-effect transistors.

7. The IC of claim 1 wherein the first and second output transistors each comprise a plurality of transistor segments of substantially equal length coupled together to form a single output transistor.

8. The IC of claim 1 wherein the first and second output transistors are coupled in parallel.

9. The IC of claim 1 wherein the first length of the first output transistor is substantially longer than the second length of the second output transistor.

10. The IC of claim 1 wherein the control circuit comprises a switched mode regulator control circuit.

11. The IC of claim 1 wherein the second area is disposed adjacent the first side, and the third area is disposed adjacent the second side.

12. The IC of claim 1 wherein the semiconductor die has a substantially rectangular shape with an aspect ratio within a range of 0.5 to 2.0.

13. An integrated circuit (IC) fabricated on a semiconductor die, comprising:
   a control circuit occupying a first area of the semiconductor die, the control circuit having first and second sides, the first side being orthogonal to the second side;
   a first output transistor occupying a second area of the semiconductor die adjacent the first side of the control circuit, the first output transistor having a plurality of segments, each of segments extending in a direction parallel to the first side and having a length substantially equal to a first length;
   a second output transistor occupying a third area of the semiconductor die adjacent the second side of the control circuit, the second output transistor having a plurality of segments, each of segments extending in a direction perpendicular to the second side, the first length being at least 20% longer than a length of the first side of the control circuit; and
   wherein at least one of the first and second output transistors are coupled to the control circuit.

14. The IC of claim 13 wherein the first and second output transistors each comprise field-effect transistors having a breakdown voltage greater than 100V.

15. The IC of claim 13 wherein the second length is substantially equal to a difference between the first length and a dimension of the first side.

16. The IC of claim 13 wherein the second output transistor has a width that is substantially equal to a dimension of the second side of the control circuit.

17. The IC of claim 13 wherein the semiconductor die has a substantially rectangular shape with an aspect ratio within a range of 0.5 to 2.0.

18. The IC of claim 13 wherein the control circuit comprises a switched mode regulator control circuit.

19. An integrated circuit (IC) fabricated on a semiconductor die, comprising:
   a control circuit occupying a first area of the semiconductor die, the first area having a first length and a first width;
   first and second output transistors respectively occupying second and third areas of the semiconductor die, the second area having a second length and a second width, and the third area having a third length and a third width, the third width being substantially equal to the first width, and the second length being substantially equal to a sum of the first and third lengths; and
   wherein at least one of the first and second output transistors are coupled to the control circuit.

20. The IC of claim 19 wherein the first and second output transistors each comprise field-effect transistors having a breakdown voltage greater than 100V.

21. The IC of claim 20 wherein the first and second output transistors each comprise source, drain, and gate terminals.

22. The IC of claim 21 wherein the gate terminal of the first output transistor is coupled to the gate terminal of the second output transistor and to the control circuit.

23. The IC of claim 22 wherein the source terminal of the first output transistor is coupled to the source terminal of the second output transistor.

24. The IC of claim 23 wherein the drain terminal of the first output transistor is coupled to the drain terminal of the second output transistor.

25. The IC of claim 19 wherein the control circuit comprises a switched mode regulator control circuit.

26. The IC of claim 19 wherein the first and second output transistors each comprise n-type field-effect transistors.

27. The IC of claim 19 wherein the first and second output transistors each comprise p-type field-effect transistors.

28. The IC of claim 19 wherein the semiconductor die has a substantially rectangular shape with an aspect ratio within a range of 0.5 to 2.0.

29. The IC of claim 19 wherein the semiconductor die has a substantially rectangular shape with an overall length and an overall width, the overall length being substantially equal to the second length, and the overall width is substantially equal to a sum of the second and third widths.

30. An integrated circuit (IC) fabricated on a semiconductor die, comprising:
   a control circuit occupying a first area of the semiconductor die, the first area having first and second sides;
   one or more output transistors occupying an L-shaped second area of the semiconductor die, the L-shaped area having first and second inner sides that are respectively disposed adjacent the first and second sides of the first area;
   wherein at least one of the first and second output transistors are coupled to the control circuit.

31. The IC of claim 30 wherein the first inner side has a length substantially equal to a length of the first side of the first area, and the second inner side has a length substantially equal to a length of the second side of the first area.

32. The IC of claim 30 wherein the L-shaped second area includes first and second outer sides, the first outer side being substantially equal to an overall length of the semiconductor die.

33. The IC of claim 30 wherein the control circuit comprises a switched mode regulator control circuit.

* * * * *